United States Patent
Takeuchi et al.

[19]

[11] Patent Number: 6,087,838
[45] Date of Patent: Jul. 11, 2000

[54] SIGNAL PROCESSING CIRCUIT FOR ELECTRO-OPTIC PROBE

[75] Inventors: Nobuaki Takeuchi; Yoshiki Yanagisawa; Jun Kikuchi; Yoshio Endou; Mitsuru Shinagawa; Tadao Nagatsuma; Junzo Yamada, all of Tokyo, Japan

[73] Assignees: Ando Electric Co., Ltd.; Nippon Telegraph and Telephone Corporation, both of Tokyo, Japan

[21] Appl. No.: 09/189,044

[22] Filed: Nov. 9, 1998

[30] Foreign Application Priority Data

Nov. 10, 1997 [JP] Japan ..................................... 9-307657

[51] Int. Cl.$^7$ ................................................. G01R 31/308
[52] U.S. Cl. ........................ 324/753; 250/208.1; 324/761
[58] Field of Search .......................... 324/753, 96, 76.15, 324/76.24, 76.38, 76.42, 121 R; 250/208.1, 25, 27.17, 306, 307; 356/351, 364, 237.4, 237.5

[56] References Cited

U.S. PATENT DOCUMENTS

| | | | |
|---|---|---|---|
| 5,057,771 | 10/1991 | Pepper | 324/753 |
| 5,500,607 | 3/1996 | Verkuil | 324/761 |
| 5,666,062 | 9/1997 | Takahashi et al. | 324/753 |

FOREIGN PATENT DOCUMENTS

| | | | |
|---|---|---|---|
| 5-40158 | 2/1993 | Japan . | |
| 5-47883 | 2/1993 | Japan . | |
| 5-82606 | 2/1993 | Japan . | H01L 21/66 |
| 5-72299 | 3/1993 | Japan . | |
| 5-80083 | 3/1993 | Japan . | |
| 5-240895 | 9/1993 | Japan . | |
| 6-94807 | 4/1994 | Japan . | |
| 7-55497 | 3/1995 | Japan . | |
| 7-55891 | 3/1995 | Japan . | |
| 8-43499 | 2/1996 | Japan . | |
| 8-152361 | 6/1996 | Japan . | |
| 8-160110 | 6/1996 | Japan . | |
| 8-262117 | 10/1996 | Japan . | |
| 9-159733 | 6/1997 | Japan . | |
| 9-197019 | 7/1997 | Japan . | |
| 9-211035 | 8/1997 | Japan . | |

OTHER PUBLICATIONS

M. Shinagawa, et al., "A High–Impedance Probe Based on Electro–Optic Sampling", Proceedings of 15th Meeting on Lightwave Sensing Technology, LST 15–17, May, 1995.

*Primary Examiner*—Josie Ballato
*Assistant Examiner*—Minh Tang
*Attorney, Agent, or Firm*—Darby & Darby

[57] ABSTRACT

A signal processing circuit is provided for an electro-optic probe, which is used to perform testing of a printed-circuit board of high-speed processing. When laser beams are incident on the electro-optic probe which is brought into contact with the printed-circuit board, they are changed in polarization and are then converted to electric signals. The electric signals are amplified and are then subjected to analog-to-digital conversion to produce digital data. The laser beams (or optical pulses) are generated based on sampling pulses used for sampling of the analog-to-digital conversion. Herein, the sampling pulses are created based on a sweep signal and a step-like signal. The sweep signal increases in level with a certain slope and then decreases suddenly in one period of a trigger pulse signal. The step-like signal increases in level in a step-like manner, wherein it is increased by a predetermined level in response to each of the sampling pulses. A comparator produces a pulse signal consisting of pulses, each of which appears when the sweep signal coincides with the step-like signal in levels. Then, a mask circuit allows output of only the necessary pulses of the comparator as the sampling pulses. An image display circuit stores a plurality of digital data therein, which are then rearranged in an order so that an image representing a measurement result is displayed.

8 Claims, 6 Drawing Sheets

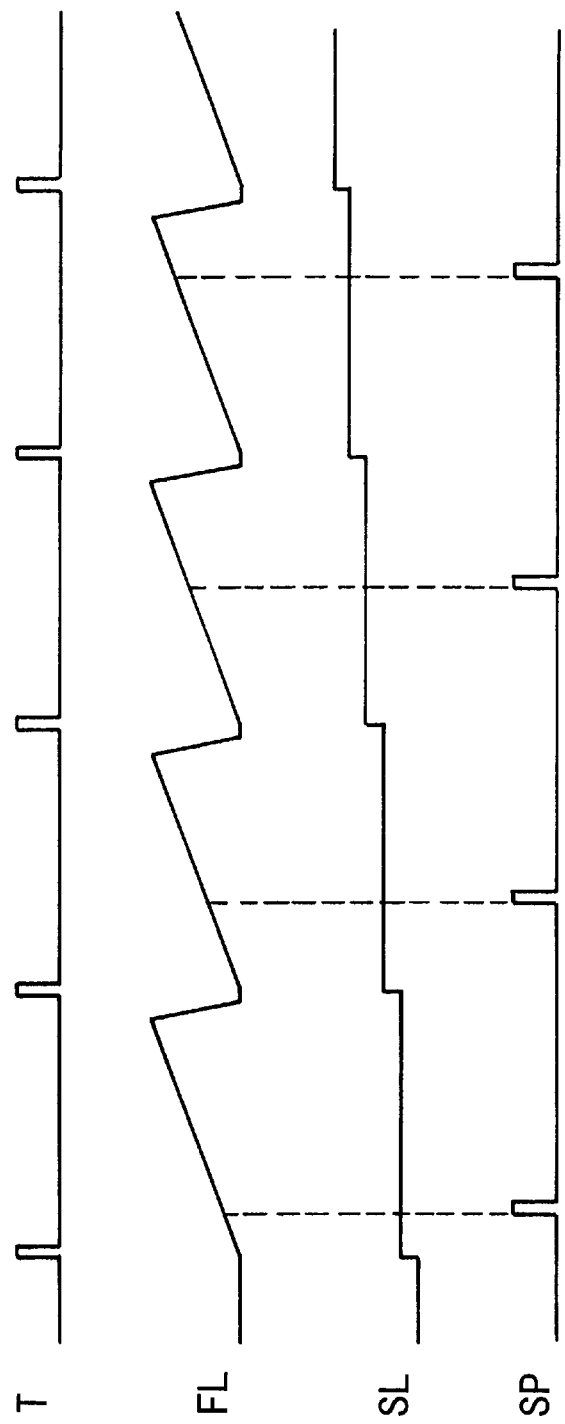
FIG.8A  T
FIG.8B  FL
FIG.8C  SL
FIG.8D  SP

SIGNAL PROCESSING CIRCUIT FOR ELECTRO-OPTIC PROBE

BACKGROUND OF THE INVENTION

1. Field of the Invention

This invention relates to signal processing circuits that process signals output from electro-optic probes used for testing of printed-circuit boards of high-speed processing.

This application is based on Patent Application No. Hei 9-307657 filed in Japan, the content of which is incorporated herein by reference.

2. Description of the Related Art

In accordance with tendencies in increases of processing speeds of information communication systems in these days, it is demanded to provide extremely high-speed processing for hardware used for the systems. As probes of sampling oscilloscopes that are required to perform testing of printed-circuit boards of high-speed processing, the recent technology develops high-impedance electro-optic probes (or electric-optic sampling probe, abbreviated by EOS).

FIG. 5 shows an example of simplified construction of an electro-optic probe. Particularly, FIG. 5 shows a head portion H of the electro-optic probe. Herein, an electro-optic crystal 1 is made of electro-optic material such as BSO (i.e., $Bi_{12}SiO_{20}$). A multilayer dielectric mirror 2 is formed on a lower surface of the electro-optic crystal 1 by vapor deposition, wherein it is capable of reflecting laser beams input thereto. In addition, a metal pin 3 is attached to the lower surface of the electro-optic crystal 1. The aforementioned electro-optic crystal 1 and the metal pin 3 are incorporated in an insulator 4.

When the metal pin 3 of the head portion H is brought into contact with a signal line 6 laid on a board 5, an electric field is caused to occur due to signals transmitted through the wiring, so the electric field is connected with the electro-optic crystal 1. Due to primary electro-optic effect such as Pockel's effect, the electro-optic crystal 1 is brought into a state that a birefringence ratio thereof is varied in response to strength of the "connected" electric field. So, by introducing laser beams into the electro-optic crystal 1 under such a state, the laser beams are changed in polarization states. The laser beams subjected to changes in polarization states are reflected by the multilayer dielectric mirror 2 and are then introduced to a polarization detection optical system (not shown) provided inside of the probe.

In the polarization detection optical system, the laser beam output from the head portion H is split into polarized components, which are perpendicular with each other in orientations, by a polarization beam splitter. Then, the polarized components of the laser beam are respectively converted to electric signals by photodiodes. The electric signals are forwarded to a signal processing circuit.

FIG. 6 is a block diagram showing an example of a configuration of the signal processing circuit. In FIG. 4, a sampling pulse generation circuit 11, which is configured by a fast ramp generation circuit 11a, a slow ramp generation circuit 11b and a comparator 11c as shown in FIG. 7. Herein, the fast ramp generation circuit 11a generates a sawtooth signal FL (see FIG. 8B) based on a trigger pulse signal T (see FIG. 8A), which is supplied thereto from the external and is synchronized with a measured signal. The sawtooth signal FL gradually increases in level with a certain slope from the timing of a trigger pulse and then decreases in level suddenly at the timing that is determined by a width of a display screen of the oscilloscope. The slow ramp generation circuit 11b generates a step-like signal SL (see FIG. 8C) based on the trigger pulse signal T. The step-like signal SL increases in level in a step-like manner, wherein it is increased by a predetermined level at the timing of a trigger pulse. The comparator 11c generates a sampling pulse signal SP (see FIG. 8D) based on the sawtooth signal FL and step-like signal SL. Herein, a sampling pulse is generated at the timing that the sawtooth signal FL coincides with the step-like signal SL in levels. Then, the sampling pulses SP are supplied to an optical pulse generation circuit 12 shown in FIG. 6.

The optical pulse generation circuit 12 uses a semiconductor laser to convert the sampling pulse signal to laser beam pulses (i.e., optical pulses), which are then forwarded to a head portion H (see FIG. 5) of an electro-optic probe DP via an optical fiber amplifier, an optical bandpass filter and a polarization controller, all of which are not shown in FIG. 6. Those optical pulses pass through the electro-optic crystal 1 of the head portion H. Thereafter, they are converted to electric signals by the aforementioned polarization detection optical system of the electro-optic probe DP. The electric signals are input to a receiving light amplification circuit 14.

The receiving light amplification circuit 14 performs differential amplification on output signals of the electro-optic probe DP. Output of the receiving light amplification circuit 14 is forwarded to an analog-to-digital conversion circuit (abbreviated by "A/D conversion circuit") 15. Based on the sampling pulse SP output from the sampling pulse generation circuit 11, the A/D conversion circuit 15 performs sampling with respect to an output of the receiving light amplification circuit 14 which is given at the timing when a prescribed time elapses from the leading-edge timing of the optical pulse. Thus, the A/D conversion circuit 15 converts analog signals, corresponding to results of the sampling, to digital data, which are then forwarded to an image display circuit 16. The image display circuit 16 performs image display processing based on output of the A/D conversion circuit 15.

By the way, the foregoing sampling pulse generation circuit 11 generates one sampling pulse in response to one trigger pulse, which is shown in FIG. 8A to FIG. 8D. For this reason, in the case where a period of the trigger pulse signal is longer than a desired sampling rate, the aforementioned signal processing circuit suffers from a problem that measurement requires an unnecessary long time.

SUMMARY OF THE INVENTION

It is an object of the invention to provide a signal processing circuit that is capable of reducing time for measurement of an electro-optic probe even if a trigger pulse signal has a long period.

A signal processing circuit of this invention is provided for an electro-optic probe, which is used to perform testing of a printed-circuit board of high-speed processing. Herein, a head portion of the electro-optic probe is mainly constructed by an electro-optic crystal, a multilayer dielectric mirror and a metal pin. When the metal pin is brought into contact with a signal line laid on the printed-circuit board, an electric field is caused to occur around the metal pin and is connected with the electro-optic crystal. Due to Pockel's effect, a birefringence ratio of the electro-optic crystal is varied in response strength of the connected electric field. So, when a laser beam is incident on the electro-optic crystal, it is changed in polarization and is reflected by the multilayer dielectric mirror. The reflected laser beam is split into two beams, which are then converted to electric signals.

The electric signals are amplified and are then subjected to analog-to-digital conversion to produce digital data. The laser beams (or optical pulses) are generated based on sampling pulses used for sampling of the analog-to-digital conversion. Herein, the sampling pulses are created based on a sweep signal and a step-like signal. The sweep signal increases in level with a certain slope and then decreases suddenly in one period of a trigger pulse signal. The step-like signal increases in level in a step-like manner, wherein it is increased by a predetermined level in response to each of the sampling pulses. A comparator produces a pulse signal consisting of pulses, each of which appears when the sweep signal coincides with the step-like signal in levels. Then, a mask circuit allows output of only the necessary pulses of the comparator as the sampling pulses.

An image display circuit stores a plurality of digital data therein, which are then rearranged in an order so that an image representing a measurement result is displayed.

Using the sampling pulses whose periods are shorter than the period of the trigger pulse signal and which are adjusted in phases, it is possible to reduce measurement time required for measurement of the printed-circuit board, for example.

BRIEF DESCRIPTION OF THE DRAWINGS

These and other objects, aspects and embodiment of the present invention will be described in more detail with reference to the following drawing figures, of which:

FIG. 8A, FIG. 8B, FIG. 8C and FIG. 8D show waveforms representing signals and pulses used in the sampling pulse generation circuit of FIG. 7.

DESCRIPTION OF THE PREFERRED EMBODIMENT

This invention will be described in further detail by way of example with reference to the accompanying drawings.

Figure 6:
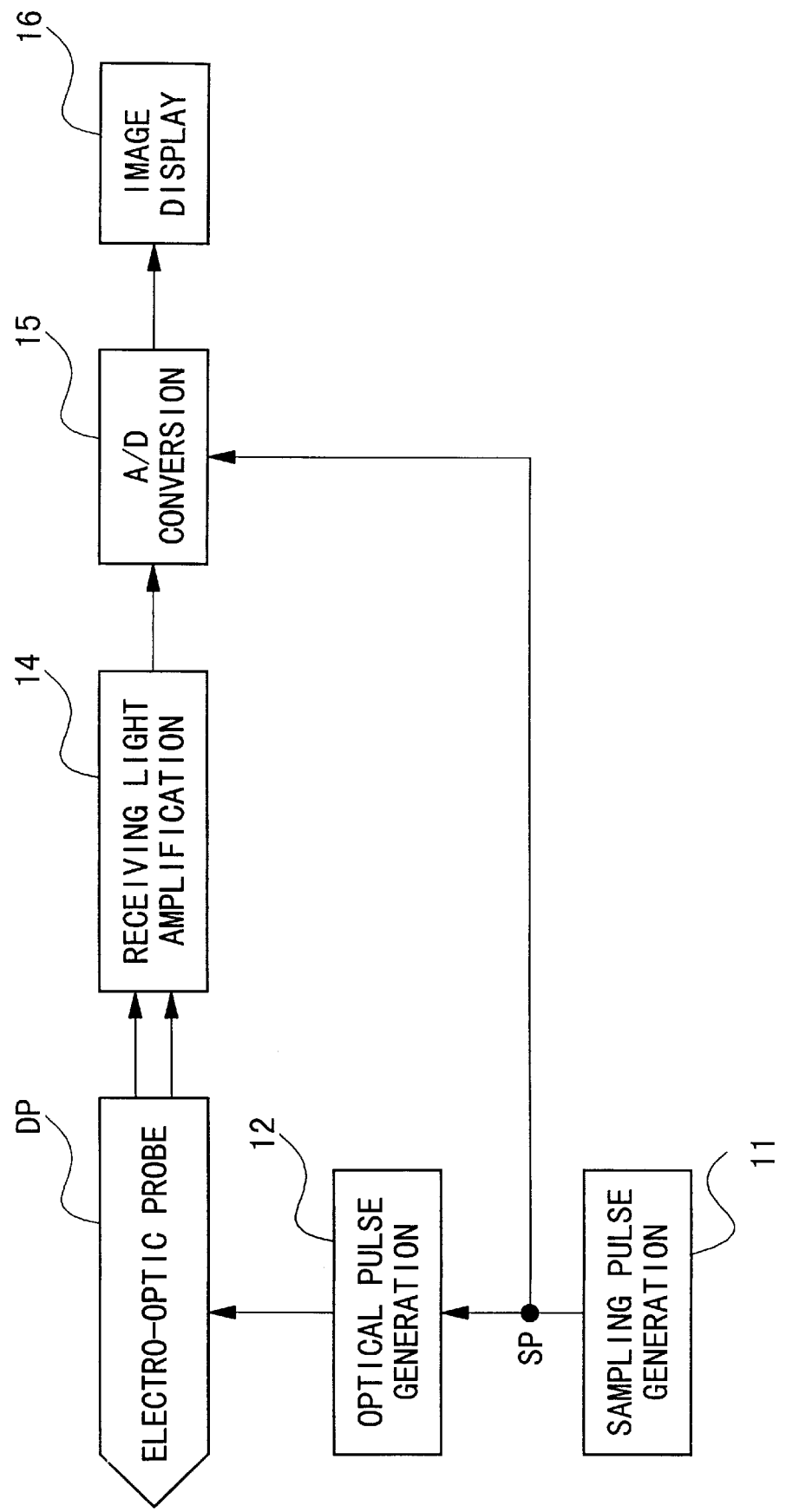
FIG. 6 is a block diagram showing an example of a configuration of the signal processing circuit for the electro-optic probe.
Figure 7:
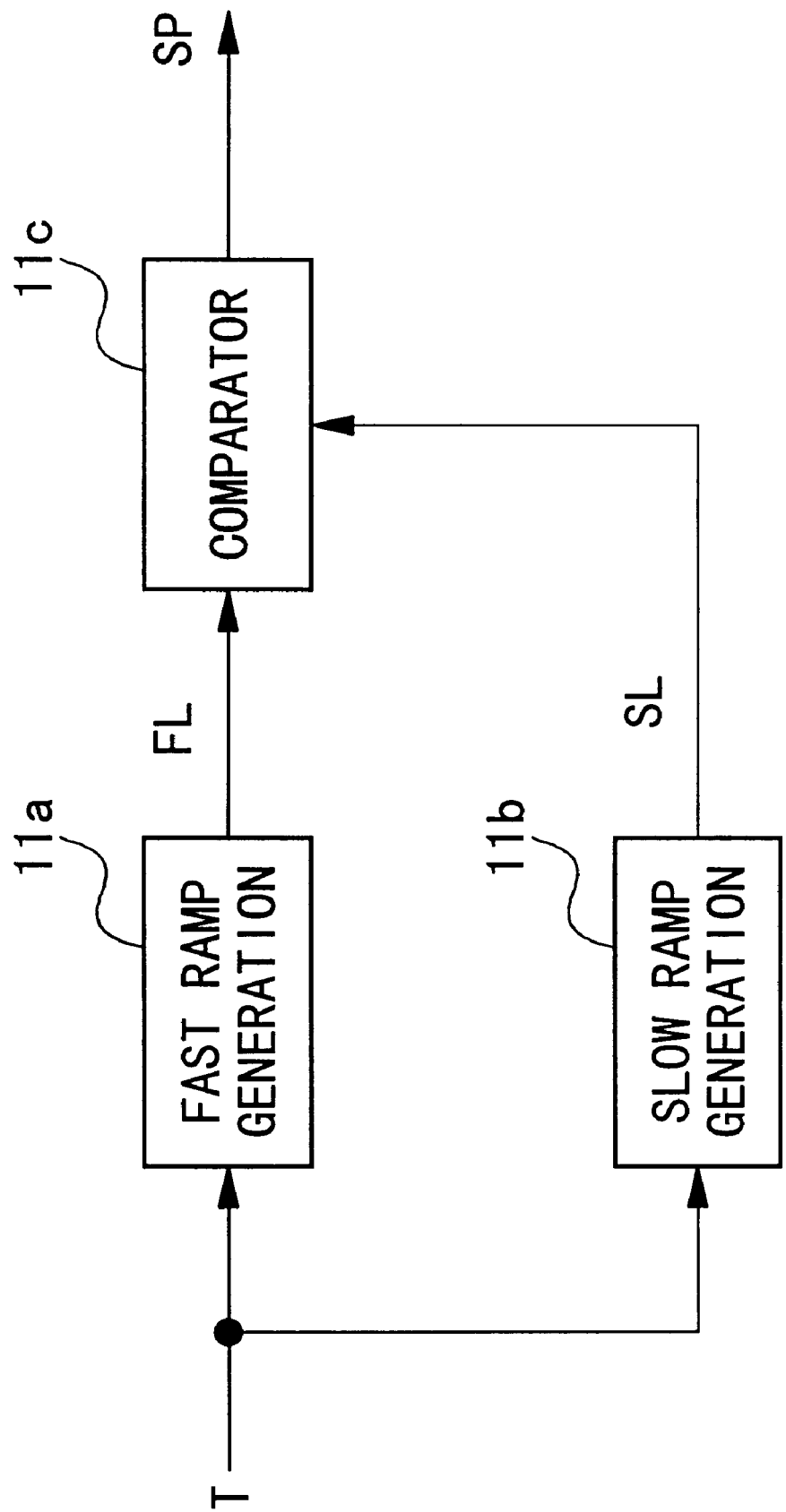
FIG. 7 is a block diagram showing an example of a detailed configuration of a sampling pulse generation circuit shown in FIG. 6.

A signal processing circuit of the preferred embodiment employs the same configuration of FIG. 6, hence, its description will be omitted. However, the technical features of the present embodiment lie in the sampling pulse generation circuit 11 and the image display circuit 16.

Figure 1:
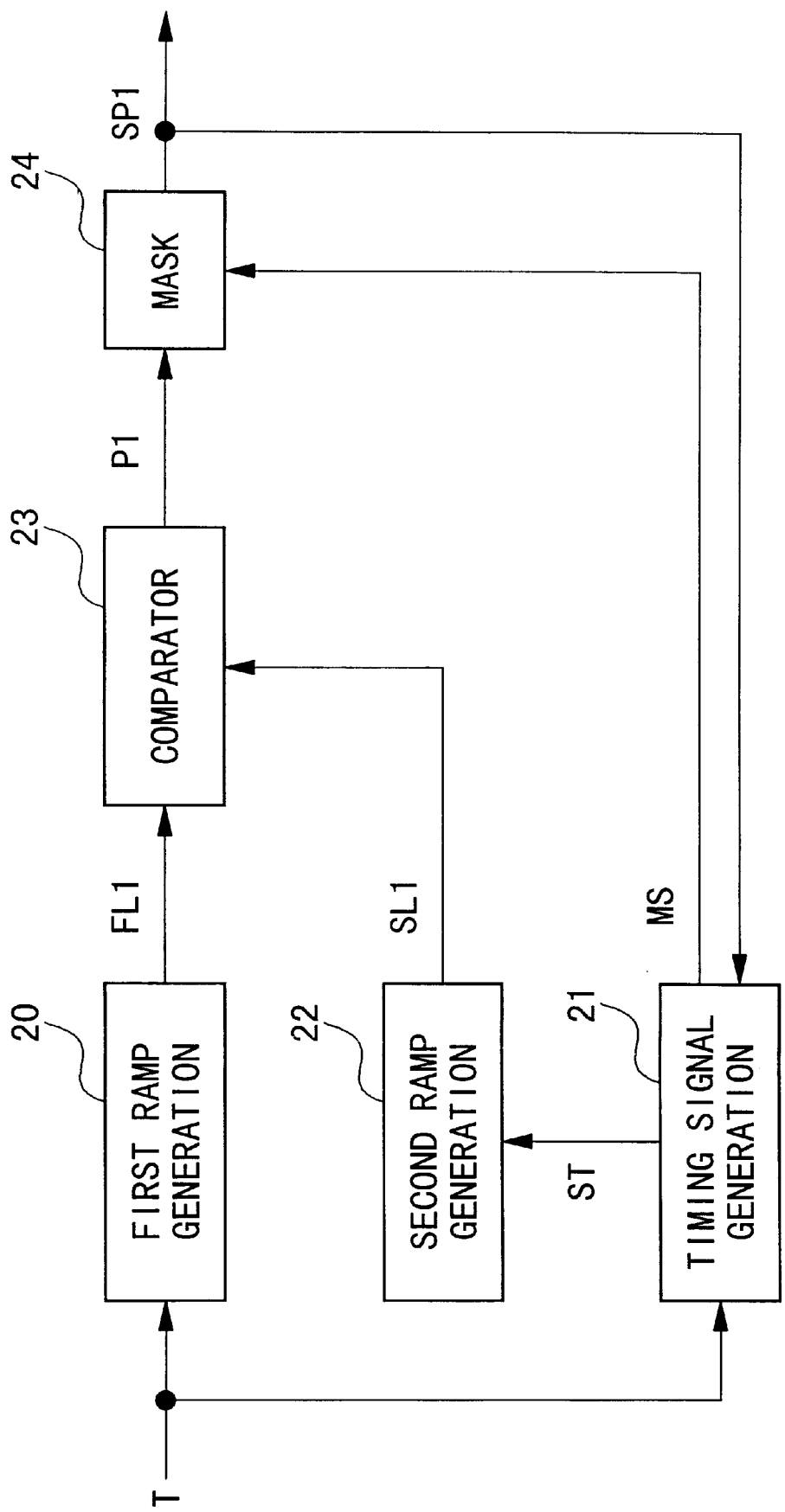
FIG. 1 is a block diagram showing a configuration of a sampling pulse generation circuit, which is an essential part of a signal processing circuit for an electro-optic probe in accordance with the embodiment of the invention.

FIG. 1 is a block diagram showing a configuration which is employed for the sampling pulse generation circuit 11 in accordance with the present embodiment of the invention. In FIG. 1, a first ramp generation circuit 20 generates a sweep signal FL1 (see FIG. 2B) based on a trigger pulse signal T (see FIG. 2A), which is given from the external and is synchronized with a measured signal. Herein, the sweep signal FL1 increases in level with a predetermined slope in response to a trigger pulse and then decreases suddenly at the timing that is determined by a width of a display screen.

Figure 2:
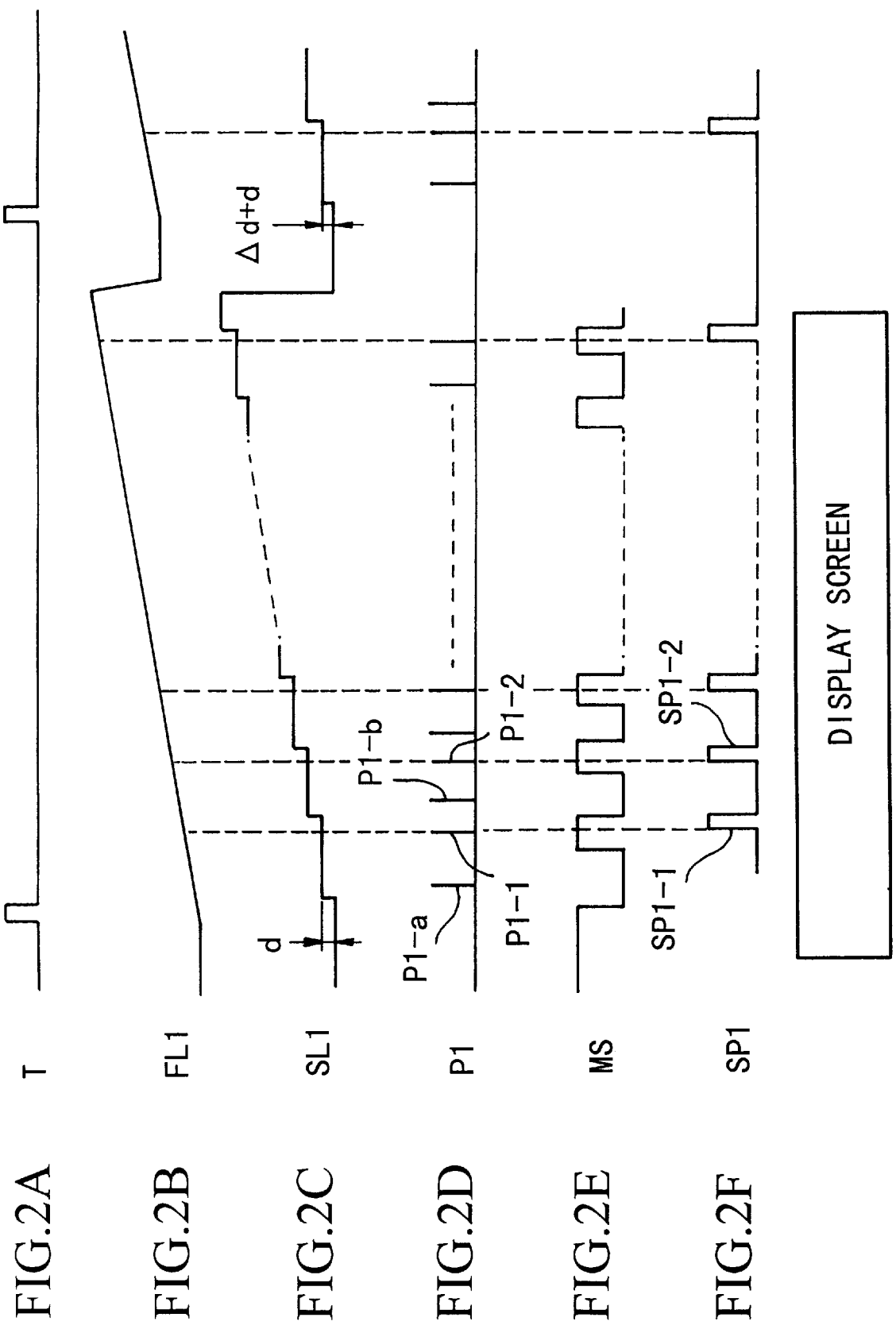
FIG. 2A, FIG. 2B, FIG. 2C, FIG. 2D, FIG. 2E and FIG. 2F show waveforms of signals and pulses used in the sampling pulse generation circuit of FIG. 1.

A timing signal generation circuit 21 generates a second ramp trigger signal consisting of pulses, each of which rises in level after a predetermined time elapses from each of sampling pulses SP1 (see FIG. 2F). In addition, the timing signal generation circuit 21 generates a mask signal MS (see FIG. 2E) containing pulses, each of which decays in level in response to each of the sampling pulses SP1 and then rises in level a predetermined time later.

A second ramp generation circuit 22 generates a step-like signal SL1 whose level rises in a step-like manner, wherein it is increased sequentially by a predetermined level at each of timings of the pulses of the second ramp trigger signal ST. A comparator 23 generates a pulse signal P1 (see FIG. 2D) consisting of pulses, which occur when the sweep signal FL1 coincides with the step-like signal SL1 in levels. The pulse signal P1 is forwarded to a mask circuit 24. The mask circuit 24 is configured by an AND gate. So, the mask circuit 24 allows output of the pulses of the pulse signal P1 when the mask signal MS is "H" level (i.e., high level). In contrast, the mask circuit 24 blocks output of the pulses of the pulse signal P1 when the mask signal MS is "L" level (i.e., low level). Outputs of the mask circuit 24 are given as the sampling pulses SP1, which are delivered to the optical pulse generation circuit 12 (see FIG. 6) as well as the timing signal generation circuit 21.

Next, a description will be given with respect to operation of the sampling pulse generation circuit of FIG. 1.

In response to a trigger pulse T given from the external, the first ramp generation circuit 20 is driven so that a sweep signal FL1 increases in level with a predetermined slope. At the same time, the second ramp generation circuit 22 is driven so that at first, a step-like signal SL1 is increased to a constant level d. When the sweep signal FL1 is increased to reach the level d so that the sweep signal FL1 and the step-like signal SL1 coincide with each other in levels, the comparator 23 outputs a pulse P1-1 of a pulse signal P1 (see FIG. 2D), which is supplied to the mask circuit 24. At this time, a mask signal MS output from the timing signal generation circuit 21 is at "H" level (see FIG. 2E). As a result, the mask circuit 24 passes the pulse P1-1, which is then output as a sampling pulse SP1-1 of a sampling pulse signal SP1 (see FIG. 2F).

As described above, the mask circuit 24 outputs the sampling pulse signal SP1, which is delivered to the timing signal generation circuit 21. Thus, the timing signal generation circuit 21 puts the mask signal MS at "L" level, then, it outputs a second ramp trigger signal ST to the second ramp generation circuit 22. Upon receipt of the second ramp trigger signal ST, the second ramp generation circuit 22 increases the step-like signal SL1 thereof to a level 2d.

Next, when the sweep signal FL1 output from the first ramp generation circuit 20 is increased to the level 2d, the comparator 23 outputs a pulse SP1-2 of the pulse signal P1 (see FIG. 2D), which is then output from the mask circuit 24 as a sampling pulse SP1-2 of the sampling pulse signal SP1 (see FIG. 2F). Thereafter, similar operations are repeated, so that the sampling pulse generation circuit of FIG. 1 outputs multiple sampling pulses SP1 in one period of the trigger pulse signal T. In this case, an interval of time between the sampling pulses SP1 depends on a level difference "d" of the step-like signal SL1.

Figure 3:
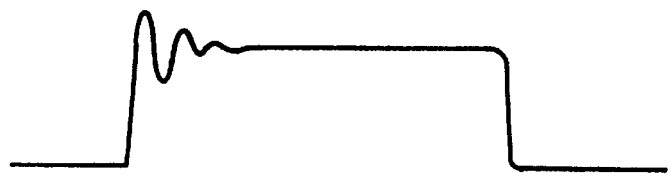
FIG. 3 shows an example of an actual waveform of output of a second ramp generation circuit shown in FIG. 1.

Next, a description will be given with respect to operation of the mask circuit 24. Strictly speaking, waveforms corresponding to shapes of steps of the step-like signal SL1 output from the second ramp generation circuit 22 do not perfectly match with rectangular waves. In fact, each waveform of the step-like signal SL1 is formed as shown in FIG. 3, wherein vibrations in level occur at a leading edge portion. Therefore, the pulse signal P1 output from the comparator 23 contains unnecessary pulses P1-$a$, P1-$b$ as shown in FIG. 2D. The mask circuit 24 is provided to eliminate such unnecessary pulses contained in the pulse signal P1. So, the mask circuit 24 is controlled in on/off states by the mask signal MS such that transmission of the unnecessary pulses are disallowed while transmission is allowed for only the necessary pulses.

Figure 4A:
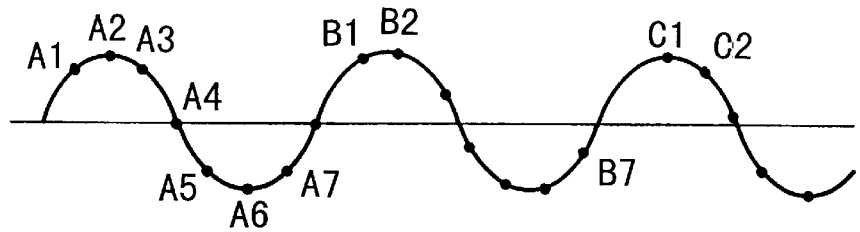
FIG. 4A shows an example of a measured waveform.
Figure 4B:
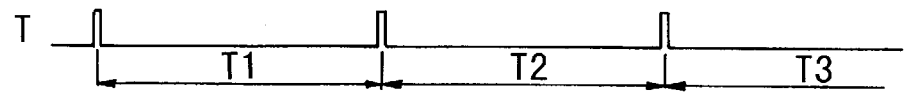
FIG. 4B shows an example of a trigger pulse signal.
Figure 4C:
FIG. 4C shows an example of sampling pulses.
Figure 5:
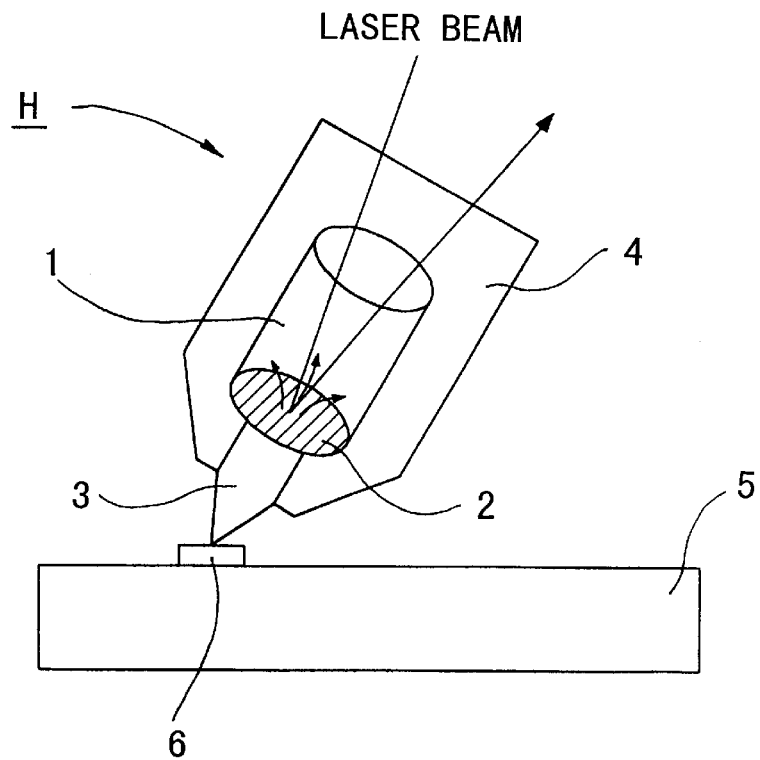
FIG. 5 shows an example of simplified construction of a head portion of the electro-optic probe.

Next, a description will be given with respect to details of the image display circuit 16. As described before in conjunction with FIG. 6, outputs of the electro-optic probe DP based on the foregoing sampling pulses SP1 are amplified by the receiving light amplification circuit 14 and are then converted to digital data by the A/D conversion circuit 15, so that the digital data are supplied to the image display circuit 16. The image display circuit 16 temporarily stores the digital data in an internal memory thereof. Suppose that a measured waveform is shown in FIG. 4A, the trigger pulse signal T is shown in FIG. 4B and the sampling pulses SP1 are shown in FIG. 4C. In a first period Ti which starts by a first trigger pulse of the trigger pulse signal T, the A/D conversion circuit 15 performs sampling with respect to points A1 to A7 on the measured waveform, so that digital data corresponding to those points are stored in the image display circuit 16.

When a second trigger pulse is given, the second ramp generation circuit 22 adds an increment $\Delta d$ (where $\Delta d << d$) to the step-like signal SL1 output therefrom. That is, the second ramp generation circuit 22 firstly outputs $\Delta d + d$. Thereafter, it sequentialy outputs $\Delta d + 2d$, $\Delta d + 3d$, ... for the step-like signal SL1 when it receives second ramp trigger signals ST respectively. In a second period T2 which starts by the second trigger pulse of the trigger pulse signal T, the A/D conversion circuit 15 performs sampling with respect to points B1 to B7 on the measured waveform shown in FIG. 4A, so that digital data are produced with respect to those points. Herein, the points B1 to B7 are slightly delayed in phases from the aforementioned points A1 to A7 respectively. In a third period T3 which starts by a third trigger pulse of the trigger signal T, the second ramp generation circuit 22 adds an increment $2\Delta d$ to the step-like signal SL1 output therefrom. Therefore, it sequentially outputs $2\Delta d + d$, $2\Delta d + 2d$, $2\Delta d + 3d$, ... for the step-like signal SL1 when it receives the second ramp trigger signals ST respectively. In the third period T3 of the trigger pulse signal T, the A/D conversion circuit 15 performs sampling with respect to points C1 to C7 respectively, so that digital data are produced with respect to those points. Herein, the points C1 to C7 are slightly delayed from the aforementioned points B1 to B7 respectively.

The image display circuit 16 sequentially stores the digital data, which are respectively produced in response to the points A1 to A7, B1 to B7, C1 to C7, . . . , in the internal memory thereof. Then, the image display circuit 16 changes an order to rearrange the digital data as follows:

A1, B1, C1 . . . A2, B2, C2 . . . A3, B3, C3 . . .

Then, the image display circuit 16 displays an image based on the digital data in accordance with the above order.

Lastly, effects of the invention will be described as follows:

It is possible to perform sampling using sampling pulses whose periods are shorter than the period of the trigger pulse signal. Therefore, it is possible to reduce measurement time particularly in the case where the trigger pulse signal has a long period. Further, the second ramp generation circuit adds a certain voltage to output thereof every time the sampling pulse occurs. For this reason, it is possible to maintain sampling periods to be substantially constant.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A signal processing circuit for an electro-optic probe, comprising:

first ramp generation means for generating a signal which increases in level with a predetermined slope at a timing to receive a trigger pulse from an external;

second ramp generation means for generating a step-like signal consisting of steps in one period of the output signal of the first ramp generation means, wherein the second ramp generation means generates the step-like signal by outputting a constant voltage after the timing to receive the trigger pulse and sequentially adding a predetermined voltage to the constant voltage in response to each of timings based on sampling pulses; and comparison means for forming a pulse signal when the output signal of the first ramp generation means coincides with the step-like signal output from the second ramp generation means, wherein the pulse signal consists of pulses, which are provided as the sampling pulses, whereby laser beams based on the sampling pulses are supplied to the electro-optic probe so that image display is performed based on output of the electro-optic probe.

2. A signal processing circuit according to claim 1 further comprising mask means to follow the comparison means, wherein the mask means is turned off in response to the sampling pulse and is turned on when a predetermined time elapses after the sampling pulse.

3. A signal processing circuit for an electro-optic probe, comprising:

first ramp generation means for generating a signal which increases in level with a predetermined slope at a timing to receive a trigger pulse from an external;

second ramp generation means for generating a step-like signal consisting of steps in one period of the output signal of the first ramp generation means, wherein the second ramp generation means generates the step-like signal by outputting a constant voltage after the timing to receive the trigger pulse and sequentially adding a predetermined voltage to the constant voltage in response to each of timings based on sampling pulses;

comparison means for forming a pulse signal when the output signal of the first ramp generation means coincides with the step-like signal output from the second ramp generation means, wherein the pulse signal consists of pulses, which are provided as the sampling pulses; and image display means for converting outputs of the electro-optic probe, which are produced by supplying laser beams based on the sampling pulses to the electro-optic probe, to a plurality of digital data which are stored therein, wherein the plurality of digital data are rearranged to display an image.

4. A signal processing circuit comprising:

sampling pulse generation means for generating sampling pulses, which are sequentially shifted in phases;

optical pulse generation means for generating optical pulses based on the sampling pulses;

an electro-optic probe, which is brought into contact with a measured object when being supplied with laser beams corresponding to the optical pulses, so that the electro-optic probe outputs signals with respect to each laser beam which is input thereto and is reflected with a change of polarization;

amplification means for performing differential amplification on the signals output from the electro-optic probe;

analog-to-digital conversion means for converting output of the amplification means to digital data; and image display means for displaying an image representing a result of measurement conducted on the measured object.

5. A signal processing circuit according to claim 4, wherein the sampling pulse generation means comprises first ramp generation means for generating a sweep signal which increases in level with a predetermined slope and then suddenly decreases in level with respect to one period of a trigger pulse signal, second ramp generation means for generating a step-like signal whose level increases in a step-like manner and then suddenly decreases within the one period of the trigger pulse signal, comparator means for performing comparison between the sweep signal and the step-like signal so as to produce a pulse signal consisting of pulses, each of which appears when the sweep signal coincides with the step-like signal in levels, and mask means for periodically masking the pulse signal in response to the sampling pulses so that selected pulses of the pulse signal are allowed to be output as the sampling pulses.

6. A signal processing circuit according to claim 4, wherein the image display means contains an internal memory that stores a plurality of digital data corresponding to results of sampling, and wherein the plurality of digital data are rearranged to display the image.

7. A signal processing circuit according to claim 4, wherein the measured object corresponds to a printed-circuit board.

8. A signal processing circuit according to claim 5 further comprising timing signal generation means for generating a second ramp trigger signal when a predetermined time elapses after each sampling pulse so that the second ramp generation means increases the step-like signal by a predetermined level, wherein the timing signal generation means generates a mask signal, which controls on/off states of the mask means such that the mask means allows output of the pulses of the comparator means at timings corresponding to the sampling pulses but the mask means disallows output of the pulses of the comparator means when a predetermined time elapses from each of the sampling pulses.

* * * * *